(12) United States Patent
Park et al.

(10) Patent No.: US 8,735,267 B1
(45) Date of Patent: May 27, 2014

(54) BURIED WORD LINE STRUCTURE AND METHOD OF FORMING THE SAME

(71) Applicants: Inho Park, Boise, ID (US); Lars Heineck, Garden City, ID (US)

(72) Inventors: Inho Park, Boise, ID (US); Lars Heineck, Garden City, ID (US)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/706,366

(22) Filed: Dec. 6, 2012

(51) Int. Cl.
*H01L 21/20* (2006.01)

(52) U.S. Cl.
USPC ............ 438/584; 257/302; 257/306; 257/220

(58) Field of Classification Search
USPC .......... 438/427, 584, 675; 257/334, E27.084, 257/401, E21.54, 329
See application file for complete search history.

(56) References Cited

U.S. PATENT DOCUMENTS

2012/0286358 A1* 11/2012 Sammi ........................ 257/334
2012/0292716 A1* 11/2012 Liu et al. ..................... 257/401

* cited by examiner

*Primary Examiner* — Charles Garber
*Assistant Examiner* — Syed Gheyas
(74) *Attorney, Agent, or Firm* — Jianq Chyun IP Office

(57) ABSTRACT

A method of forming a buried word line structure is provided. A first mask layer, an interlayer and a second mask layer are sequentially formed on a substrate, wherein the second mask layer has a plurality of mask patterns and a plurality of gaps arranged alternately, and the gaps includes first gaps and second gaps arranged alternately. A dielectric pattern is formed in each first gap and spacers are simultaneously formed on sidewalls of each second gap, wherein a first trench is formed between the adjacent spacers and exposes a portion of the first mask layer. The mask patterns are removed to form second trenches. An etching process is performed by using the dielectric patterns and the spacers as a mask, so that the first trenches are deepened to the substrate and the second trenches are deepened to the first mask layer.

5 Claims, 3 Drawing Sheets

BURIED WORD LINE STRUCTURE AND METHOD OF FORMING THE SAME

BACKGROUND OF THE INVENTION

1. Field of Invention

The present invention relates to a semiconductor structure and a method of forming the same, and more generally to a buried word line structure and a method of forming the same.

2. Description of Related Art

Non-volatile memories provide the property of multiple entries, retrievals and erasures of data, and are able to retain the stored information even when the electrical power is off. As a result, non-volatile memories are widely used in personal computers and consumer electronic products.

As the degree of integration of a non-volatile memory is getting higher, the critical dimension of the same is getting smaller. A buried word line structure is often employed in sub-28 nm memory technology or below to meet demands for scaling down the devices.

In order to effectively integrate active areas with isolation areas, for example, in a buried-WL DRAM structure, a portion of buried word lines can serve as active word lines for controlling the transistors in the cells, while another portion of buried word lines can serve as cell-to-cell isolation word lines. However, it has been difficult to effectively form such structure with the existing process steps.

SUMMARY OF THE INVENTION

Accordingly, the present invention provides a method of forming a buried word line structure, in which active areas and isolation areas can be effectively integrated with the existing process steps (e.g. a logic process).

The present invention further provides a buried word line structure, in which the isolation word lines are deeper and narrower than the active word lines.

The present invention provides a method of forming a buried word line structure. A first mask layer, an interlayer and a second mask layer are sequentially formed on a substrate, wherein the second mask layer has a plurality of mask patterns and a plurality of gaps arranged alternately, and the gaps includes first gaps and second gaps arranged alternately. A dielectric pattern is formed in each first gap and spacers are simultaneously formed on sidewalls of each second gap, wherein a first trench is formed between the adjacent spacers and exposes a portion of the first mask layer. The mask patterns are removed to form second trenches. An etching process is performed by using the dielectric patterns and the spacers as a mask, so that the first trenches are deepened to the substrate and the second trenches are deepened to the first mask layer.

According to an embodiment of the present invention, the second trenches are wider than the first trenches.

According to an embodiment of the present invention, after the etching process, the method further includes removing the dielectric patterns and the spacers; removing the interlayer; and deepening the first and second trenches by using the first mask layer as a mask.

According to an embodiment of the present invention, after the step of deepening the first and second trenches, the method further includes removing the first mask layer; and filling first conductors in the first trenches and filling second conductors in the second trenches.

According to an embodiment of the present invention, the first conductors serve as isolation word lines and the second conductors serve as active word lines.

According to an embodiment of the present invention, after the step of deepening the first and second trenches and before the step of forming the first and second conductors, the method further includes forming a gate dielectric layer to separate each of the active word lines and the isolation word lines from the substrate.

According to an embodiment of the present invention, the second gaps are wider than the first gaps.

According to an embodiment of the present invention, the step of forming the dielectric patterns and the spacers includes the following steps. A dielectric layer is formed on the substrate to completely fill the first gaps but not completely fill the second gaps. A spacer etching is performed on the dielectric layer until top surfaces of the mask patterns are exposed, so that the remaining dielectric layer forms the dielectric patterns in the first gaps and forms the spacers on the sidewalls of the second gaps. Besides, the step of performing the spacer etching further removes the interlayer in the second gaps not covered by the spacers.

According to an embodiment of the present invention, the dielectric layer includes silicon oxide.

According to an embodiment of the present invention, the first mask layer and the second mask layer are formed from the same material.

According to an embodiment of the present invention, the first mask layer exposed by the first trenches and the interlayer and a portion of the first mask layer exposed by the second trenches are removed during the step of removing the mask patterns.

According to an embodiment of the present invention, the interlayer is different from the first mask layer or the second mask layer.

According to an embodiment of the present invention, the first mask layer includes carbon.

According to an embodiment of the present invention, the second mask layer includes carbon.

According to an embodiment of the present invention, the interlayer includes silicon oxynitride or silicon nitride.

The present invention further provides a buried word line structure. The buried word line structure includes a substrate having a plurality of first trenches and a plurality of second trenches therein, a plurality of first conductors respectively filling in the first trenches, and a plurality of second conductors, respectively filling in the second trenches. Besides, the first trenches are narrower and deeper than the second trenches.

According to an embodiment of the present invention, the first conductors serve as isolation word lines and the second conductors serve as active word lines.

According to an embodiment of the present invention, the buried word line structure further includes a gate dielectric layer configured to separate each of the active word lines and the isolation word lines from the substrate.

According to an embodiment of the present invention, two separate second trenches are disposed between two adjacent first trenches.

According to an embodiment of the present invention, a width of the first trenches is about $2/3$ to $1/2$ of a width of the second trenches, and a depth of the second trenches is about $2/3$ to $1/2$ of a depth of the first trenches.

In view of the above, extremely narrow isolation word line trenches that are even deeper than wider active word line trenches can be easily realized with the method of the present invention. Therefore, the cell size shrinkage can be achieved and the cell density can be accordingly increased.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
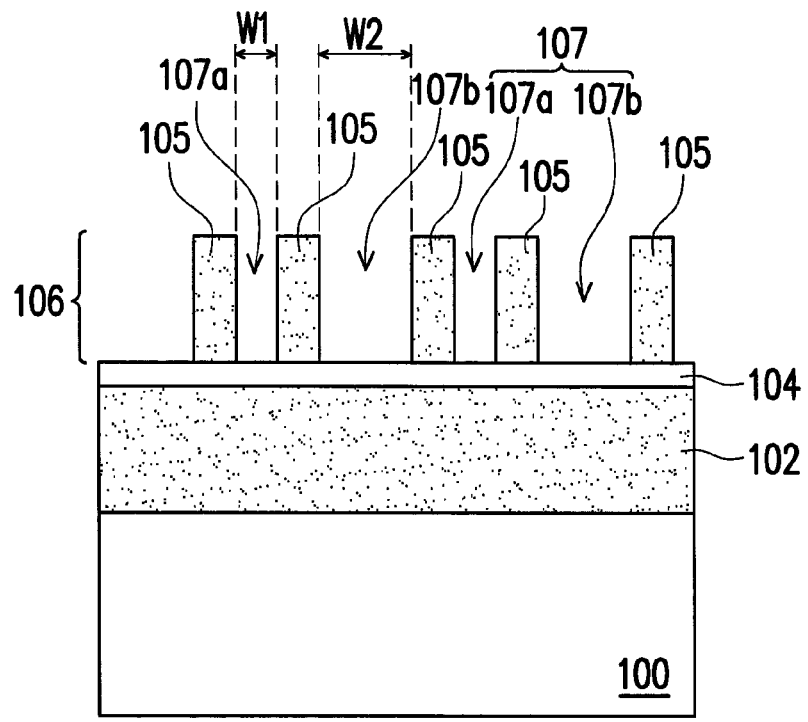
FIG. 1A to FIG. 1G are schematic cross-sectional views illustrating a method of forming a buried word line structure.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1G are schematic cross-sectional views illustrating a method of forming a buried word line structure.

Referring to FIG. 1A, a first mask layer 102 and an interlayer 104 are sequentially formed on a substrate 100. The substrate 100 can be a semiconductor substrate, such as a silicon substrate. The first mask layer 102 includes carbon. The examples of the first mask layer 102 include amorphous carbon, carbon-containing oxide, carbon-containing oxynitride, carbon-containing nitride, and all spin-on hard masks. The interlayer 104 includes silicon oxynitride or silicon nitride. The first mask layer 102 and the interlayer 104 can be formed through atmospheric pressure CVD (APCVD), low-pressure CVD (LPCVD), plasma-enhanced CVD (PECVD), high-density plasma CVD (HDP-CVD), radical-enhanced CVD (RECVD), atomic layer deposition (ALD), atomic-layer CVD (ALCVD) or any other suitable method. The first mask layer 102 is thicker than the interlayer 104. For example, the thickness of the first mask layer 102 ranges from about 1000 to 2000 angstroms, and the thickness of the interlayer 104 ranges from about 150 to 260 angstroms.

Thereafter, a second mask layer 106 is formed on the interlayer 104. The second mask layer 106 has a plurality of mask patterns 105 and a plurality of gaps 107 arranged alternately, and the gaps 107 includes first gaps 107a and second gaps 107b arranged alternately. Specifically, the second mask layer 106 has one mask pattern 105, one first gap 107a, another one mask pattern 105, one second gap 107b arranged repeatedly in a sequence. It is noted that the second gaps 107b are wider than the first gaps 107a. As shown in FIG. 1A, the width W2 of the second gaps 107b is greater than the width W1 of the first gaps 107a. For example, the width W1 ranges from about 15 to 20 nm, and the width W2 ranges from about 45 to 60 nm. The second mask layer 106 includes carbon. The examples of the second mask layer include amorphous carbon, carbon-containing oxide, carbon-containing oxynitride, carbon-containing nitride, and all spin-on hard masks. The interlayer 104 can be different from the first mask layer 102 or the second mask layer 106. In addition, the material of the second mask layer 106 can be the same as or different from that of the first mask layer 102. In this embodiment, the first mask layer 102 and the second mask layer 106 are formed from the same material. The method of forming the second mask layer 104 includes forming a mask layer (not shown) on the substrate 100 with a deposition process, and then patterning the mask layer with photolithography and etching processes. The second mask layer 106 is thicker than the interlayer 104. The thickness of the second mask layer 106 ranges from about 500 to 1000 angstroms, for example.

Figure 1B:
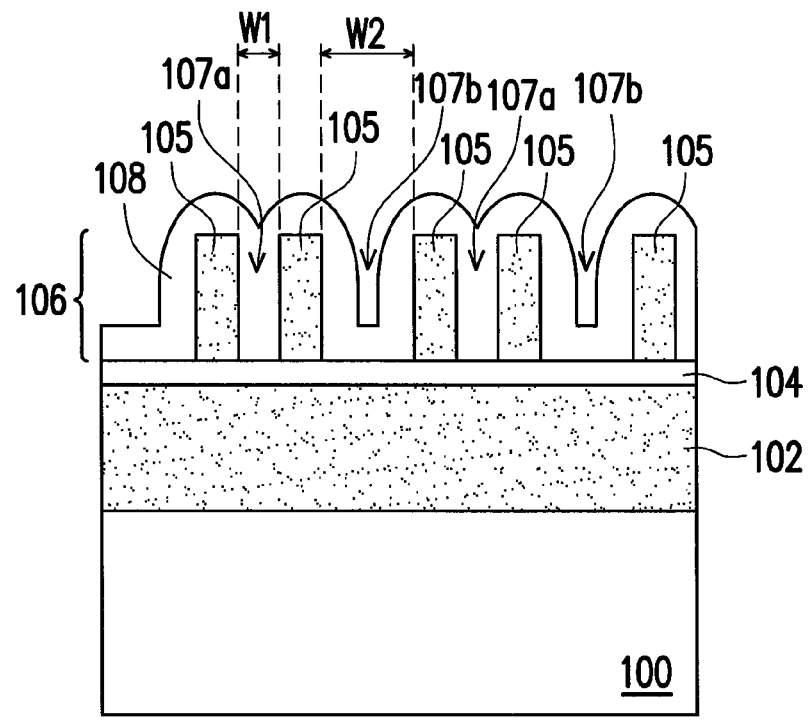

Referring to FIG. 1B, a dielectric layer 108 is formed on the substrate 100 to completely fill the first gaps 107a but not completely fill the second gaps 107b. The dielectric layer 108 includes silicon oxide, such as tetraethoxysilane (TEOS) silicon oxide. The dielectric layer 108 can be formed through APCVD, LPCVD, PECVD, HDP-CVD, RECVD, ALD, ALCVD or any other suitable method.

Figure 1C:
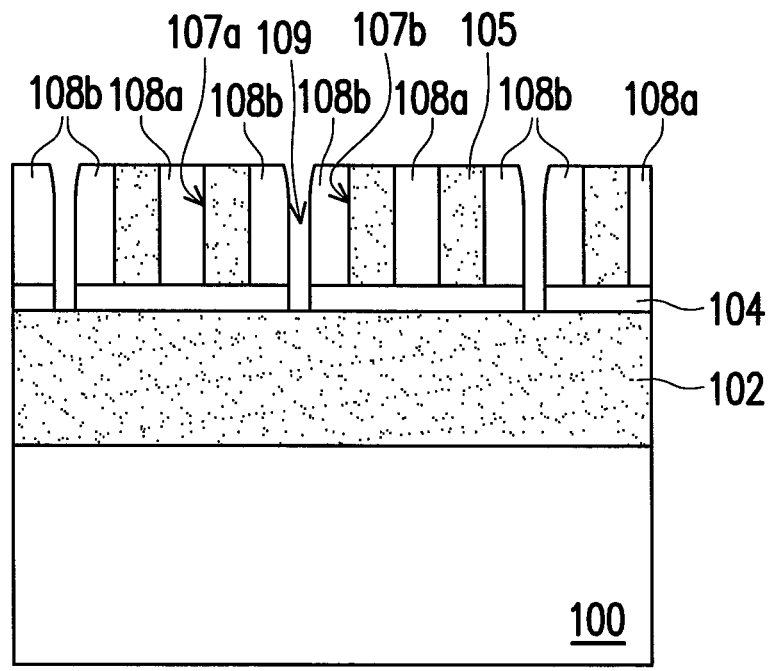

Referring to FIG. 1C, a spacer etching is performed on the dielectric layer 108 until top surfaces of the mask patterns 105 are exposed, so that the remaining dielectric layer 108 forms a dielectric pattern 108a in each first gap 107a and simultaneously forms spacers 108b on sidewalls of each second gap 107b. In this embodiment, the step of performing the spacer etching further removes the interlayer 104 in the second gaps 107b not covered by the spacers 108b, so that a first trench 109 is formed between the adjacent spacers 108b and exposes a portion of the first mask layer 102.

Figure 1D:
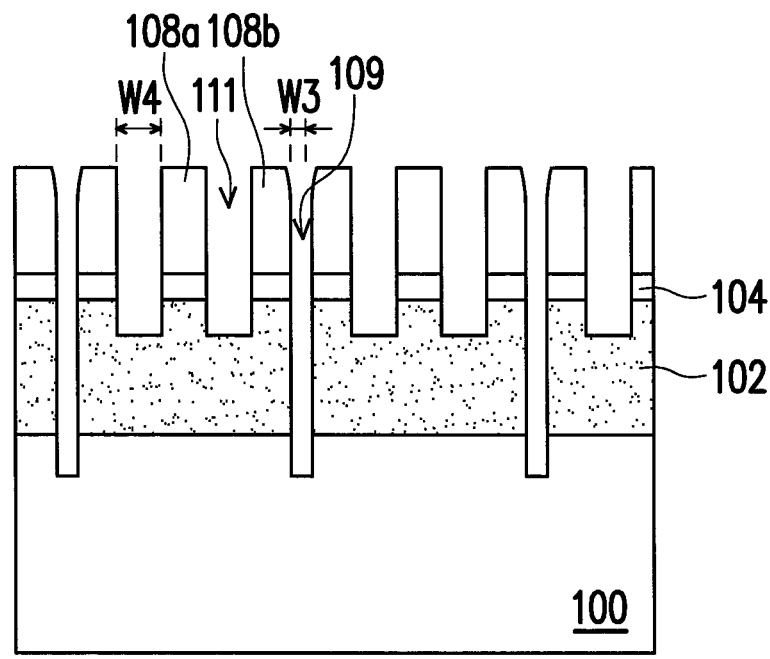

Referring to FIG. 1D, the mask patterns 105 are removed to form second trenches 111. The removing step includes performing an etching process. Since the first mask layer 102 and the mask patterns 105 (of the second mask layer 106) are formed from the same material and the interlayer 104 are thin enough, the first mask layer 102 exposed by the first trenches 109 and the interlayer 104 and a portion of the first mask layer 102 exposed by the second trenches 111 are simultaneously removed during the step of removing the mask patterns 105. In other words, after the step of removing the mask patterns 105, the first trenches 109 are through the first mask layer 102 (or even slightly extended to the substrate 100), and the second trenches 111 are extended to the first mask layer 102. Specifically, the interlayer 104 is opened in the positions of the first trenches 109 but not in the positions of the second trenches 111 (as shown in FIG. 1C), and therefore, the first trenches 109 can be etched to be much deeper than the second trenches 111 after the step of FIG. 1D. It is noted that the second trenches 111 are wider than the first trenches 109. As shown in FIG. 1D, the width W4 of the second trenches 111 is greater than the width W3 of the first trenches 109. In an embodiment, the width W3 is about ⅔ to ½ of the width W4. For example, the width W3 ranges from about 15 to 20 nm, and the width W4 ranges from about 10 to 15 nm.

Figure 1E:
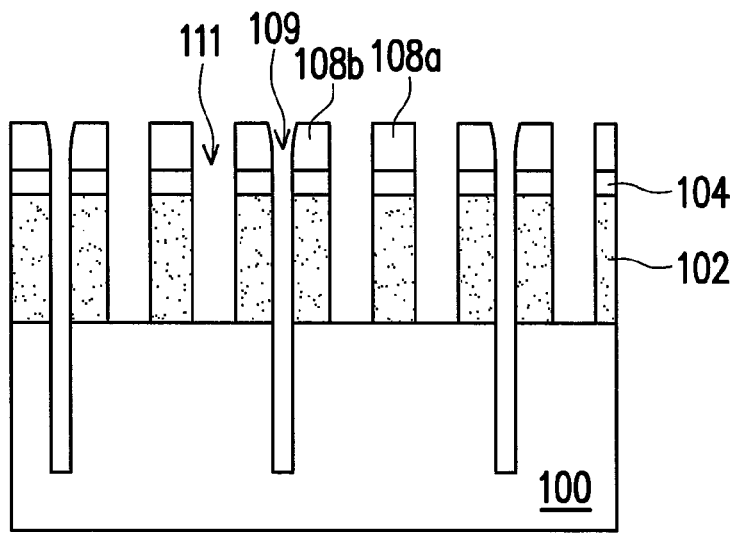

Referring to FIG. 1E, an etching process is performed by using the dielectric patterns 108a and the spacers 108b as a mask, so that the first trenches 109 are deepened to the substrate 100 and the second trenches 111 are deepened to the first mask layer 102. After the etching process of FIG. 1E, the depth of the first trenches 109 (where isolation word lines are subsequently formed) almost reaches the desired value, while the depth of the second trenches 111 (where active word lines are subsequently formed) substantially reaches the interface between the substrate 100 and the first mask layer 102. The etching process in FIG. 1E can be regarded as an isolation trench etching step.

Figure 1F:
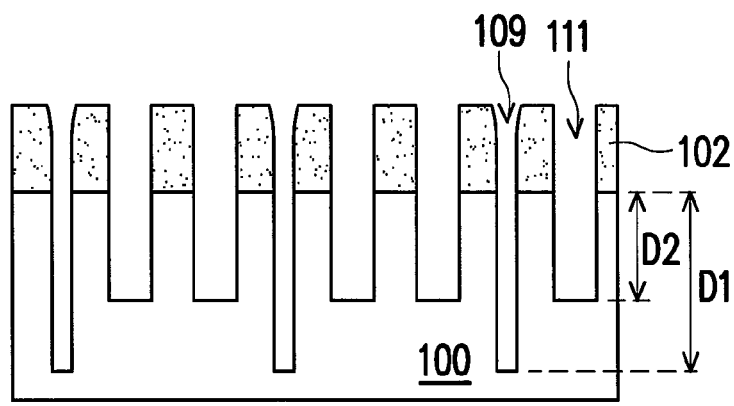

Referring to FIG. 1F, the dielectric patterns 108s and the spacers 108b are removed through an etching process. Thereafter, the interlayer 104 are removed through another etching process.

Afterwards, the first trenches 109 and the second trenches 111 are deepened by using the first mask layer 102 as an etching mask. Specifically, during the step of deepening the first and second trenches 109 and 111, polymer may accumulate on sidewalls of the narrower first trenches 109 and slow down the etching rate at the first trenches 109. Accordingly, the wider second trenches 111 can be deepened with a greater etching rate than the narrower first trenches 109, but the resulting second trenches 111 are still shallower than the first trenches 109. As shown in FIG. 1F, the depth D1 of the first trenches 109 is greater than the depth D2 of the second trenches 111. In an embodiment, the depth D2 is about ⅔ to ½ of the depth D1. For example, the depth D1 ranges from about 220 to 260 nm, and the depth D2 ranges from about 130 to 170 nm. The step of deepening the first and second trenches 109 and 111 in FIG. 1F can be regarded as an active trench etching step.

Figure 1G:
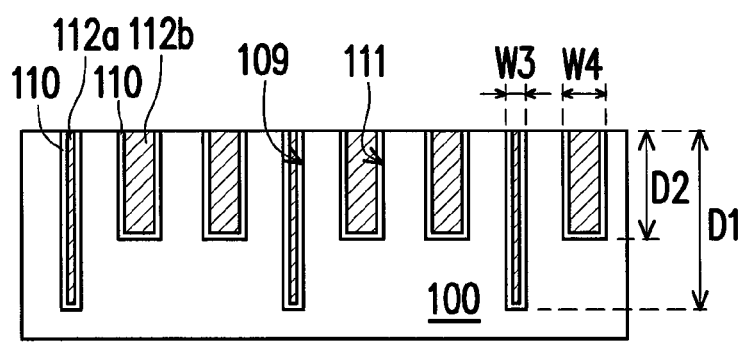

Referring to FIG. 1G, the first mask layer 102 is removed through an etching process. Thereafter, a gate dielectric layer 110 is formed on the surface of each of the first and second trenches 109 and 111. The gate dielectric layer 110 includes silicon oxide, and the forming method thereof includes performing a thermal oxide process. Afterwards, first conductors 112a are filled in the first trenches 109 and second conductors 112b are simultaneously filled in the second trenches 111. The first conductors 112a and the second conductors 112b include at least one of polysilicon or metals (e.g. TiN or W/TiN, TiN/TaN). The method of forming the first conductors 112a and the second conductors 112b includes forming a conductive layer (not shown) on the substrate 100 filling in the first and second trenches 109 and 111, and then patterning the conductive layer through photolithography and etching processes, so as to remove the conductive layer outside of the first and second trenches 109 and 111. Other components such as source/drain regions, bit lines and etc. are well-known to persons skilled in the art, and the dispositions, materials and forming methods thereof are not iterated herein. The buried word line structure of the present invention is thus completed. The first conductors 112a serve as isolation word lines, the second conductors 112b serve as active word lines, and the gate dielectric layer 110 is for separating each of the active word lines and the isolation word lines from the substrate 100.

The buried word line structure of the present invention is described below with reference to FIG. 1G.

Referring to FIG. 1G, the buried word line structure includes a substrate 100, a plurality of first conductors 112a and a plurality of second conductors 112b. The substrate 100 has plurality of first trenches 109 and a plurality of second trenches 111 therein, wherein the first trenches 109 are narrower and deeper than the second trenches 111. In an embodiment, the width W3 of the first trenches 109 is about ⅔ to ½ of the width W4 of the second trenches 111, and the depth D2 of the second trenches 111 is about ⅔ to ½ of the depth D1 of the first trenches 109. The first conductors 112a respectively fill in the first trenches 109. The second conductors 112b respectively fill in the second trenches 111.

The first conductors 112a serve as isolation word lines and the second conductors 112b serve as active word lines. In an embodiment, the buried word line structure further includes a gate dielectric layer 110 configured to separate each of the active word lines and the isolation word lines from the substrate 100.

In an embodiment, one first trench 109, one second trench 111, another second trench 111 and another first trench 109 are arranged repeatedly in a sequence, as shown in FIG. 1G. In other words, two separate second trenches 111 are disposed between two adjacent first trenches 109. However, the present invention is not limited thereto. In another embodiment, one or more than two second trenches 111 can be disposed between two adjacent first trenches 109 upon the actual requirements.

In summary, in the buried word line structure of the present invention, the isolation word line trenches can be formed to be narrower and deeper than the active word line trenches, so as to enhance efficiency in active area use, increase the cell size shrinkage and therefore the cell density. Besides, the method in accordance with the present invention is simple and compatible with the known technologies. In other words, the disclosed method can effectively integrate active areas and isolation areas with the existing process steps (e.g. a logic process).

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A buried word line structure, comprising:
 a substrate, having a plurality of first trenches and a plurality of second trenches therein, wherein the first trenches are narrower and deeper than the second trenches;
 a plurality of first conductors, respectively filling in the first trenches; and
 a plurality of second conductors, respectively filling in the second trenches.

2. The buried word line structure of claim 1, wherein the first conductors serve as isolation word lines and the second conductors serve as active word lines.

3. The buried word line structure of claim 2, further comprising a gate dielectric layer configured to separate each of the active word lines and the isolation word lines from the substrate.

4. The buried word line structure of claim 1, wherein two separate second trench are disposed between two adjacent first trenches.

5. The buried word line structure of claim 1, wherein a width of the first trenches is about ⅔ to ½ of a width of the second trenches, and a depth of the second trenches is about ⅔ to ½ of a depth of the first trenches.

* * * * *